United States Patent
Vilangudipitchai et al.

(10) Patent No.: US 9,685,940 B2
(45) Date of Patent: Jun. 20, 2017

(54) VOLTAGE COMPARATOR

(71) Applicant: QUALCOMM Incorporated, San Diego, CA (US)

(72) Inventors: Ramaprasath Vilangudipitchai, San Diego, CA (US); Dorav Kumar, San Diego, CA (US); Steven James Dillen, San Diego, CA (US); Ohsang Kwon, San Diego, CA (US); Javid Jaffari, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 8 days.

(21) Appl. No.: 14/818,114

(22) Filed: Aug. 4, 2015

(65) Prior Publication Data
US 2016/0248414 A1    Aug. 25, 2016

Related U.S. Application Data

(60) Provisional application No. 62/120,798, filed on Feb. 25, 2015, provisional application No. 62/126,311, filed on Feb. 27, 2015.

(51) Int. Cl.
*H03K 17/04*    (2006.01)
*H03K 17/042*   (2006.01)
*H03K 5/24*     (2006.01)
*H03K 19/00*    (2006.01)
*H03K 5/26*     (2006.01)

(52) U.S. Cl.
CPC ......... *H03K 17/04206* (2013.01); *H03K 5/24* (2013.01); *H03K 19/0016* (2013.01); *H03K 5/26* (2013.01)

(58) Field of Classification Search
CPC .. H03K 17/04; H03K 17/04123; H03K 19/01; H03K 17/04106; H03K 17/04113; H03K 17/0412; H03K 17/04126
USPC .................................................. 327/374, 376
See application file for complete search history.

(56) References Cited

U.S. PATENT DOCUMENTS 7,573,152 B2    8/2009   Jacob et al.
7,630,841 B2   12/2009   Comisky et al.
7,737,720 B2    6/2010   Idgunji et al.
8,327,163 B2   12/2012   Chen
(Continued)

OTHER PUBLICATIONS

International Search Report and Written Opinion—PCT/US2016/013965—ISA/EPO—Apr. 7, 2016.

*Primary Examiner* — Lincoln Donovan
*Assistant Examiner* — Diana J Cheng
(74) *Attorney, Agent, or Firm* — Loza & Loza, LLP/Qualcomm

(57) ABSTRACT

Systems and methods for powering up circuits are described herein. In one embodiment, a method for power up comprises comparing a voltage of a first supply rail with a voltage of a second supply rail, and determining whether the voltage of the first supply rail is within a predetermined amount of the voltage of the second supply rail for at least a predetermined period of time based on the comparison. The method also comprises initiating switching of a plurality of switches coupled between the first and second supply rails upon a determination that the voltage of the first supply rail is within the predetermined amount of the voltage of the second supply rail for at least the predetermined period of time.

19 Claims, 9 Drawing Sheets

(56) References Cited

U.S. PATENT DOCUMENTS

| | | |
|---|---|---|
| 8,680,710 B2 | 3/2014 | Nogawa |
| 8,742,970 B2 * | 6/2014 | Lesso .................. H03M 1/34 341/157 |
| 2005/0289367 A1 | 12/2005 | Clark et al. |
| 2008/0272809 A1 | 11/2008 | Idgunji et al. |
| 2009/0115258 A1 | 5/2009 | Flynn et al. |
| 2014/0015590 A1 | 1/2014 | Yoon et al. |

* cited by examiner

VOLTAGE COMPARATOR

RELATED APPLICATIONS

This application claims priority under 35 U.S.C. §119(e) to U.S. Provisional Application No. 62/120,798 filed on Feb. 25, 2015, and U.S. Provisional Application No. 62/126,311 filed on Feb. 27, 2015, the entire specifications of which are incorporated herein by reference.

BACKGROUND

Field

Aspects of the present disclosure relate generally to systems and methods for powering up circuits, and more particularly, to reducing the time to power up a circuit using a voltage comparator.

Background

A circuit (e.g., a CPU, a GPU, a processor core, etc.) may be selectively coupled to a power supply rail by an array of head switches. The head switches may decouple the circuit from the power supply rail when the circuit is in an inactive state (e.g., sleep state), and couple the circuit to the power supply rail when the circuit is in an active state (e.g., functional state). For example, the head switches may decouple the circuit from the power supply rail to reduce power leakage when the circuit is in the inactive state.

To power up a circuit from the inactive state to the active state, the head switches may be sequentially switched on (tuned on) by a power sequencer to ramp up the voltage of the circuit. Before power up, capacitors in the circuit may be fully discharged. As a result, during initial power up, the circuit may draw a large current from the power supply rail to charge the capacitors, creating a voltage droop on the power supply rail. If the power up is too fast, the voltage droop may be large enough to cause other circuits coupled to the power supply to malfunction. To prevent this, the power up may be slowed down by inserting delays between the head switches.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a power-up system is described herein. The system comprises a voltage comparator configured to compare a voltage of a first supply rail with a voltage of a second supply rail, and to output an output signal based on the comparison. The system also comprises a controller configured to determine whether the voltage of the first supply rail is within a predetermined amount of the voltage of the second supply rail for at least a predetermined period of time based on the output signal of the voltage comparator, and, upon a determination that the voltage of the first supply rail is within the predetermined amount of the voltage of the second supply rail for at least the predetermined period of time, to initiate switching of a plurality of switches coupled between the first and second supply rails.

A second aspect relates to a method for power up. The method comprises comparing a voltage of a first supply rail with a voltage of a second supply rail, and determining whether the voltage of the first supply rail is within a predetermined amount of the voltage of the second supply rail for at least a predetermined period of time based on the comparison. The method also comprises initiating switching of a plurality of switches coupled between the first and second supply rails upon a determination that the voltage of the first supply rail is within the predetermined amount of the voltage of the second supply rail for at least the predetermined period of time.

A third aspect relates to an apparatus for power up. The apparatus comprises means for comparing a voltage of a first supply rail with a voltage of a second supply rail, and means for determining whether the voltage of the first supply rail is within a predetermined amount of the voltage of the second supply rail for at least a predetermined period of time based on the comparison. The apparatus also comprises means for initiating switching of a plurality of switches coupled between the first and second supply rails upon a determination that the voltage of the first supply rail is within the predetermined amount of the voltage of the second supply rail for at least the predetermined period of time.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
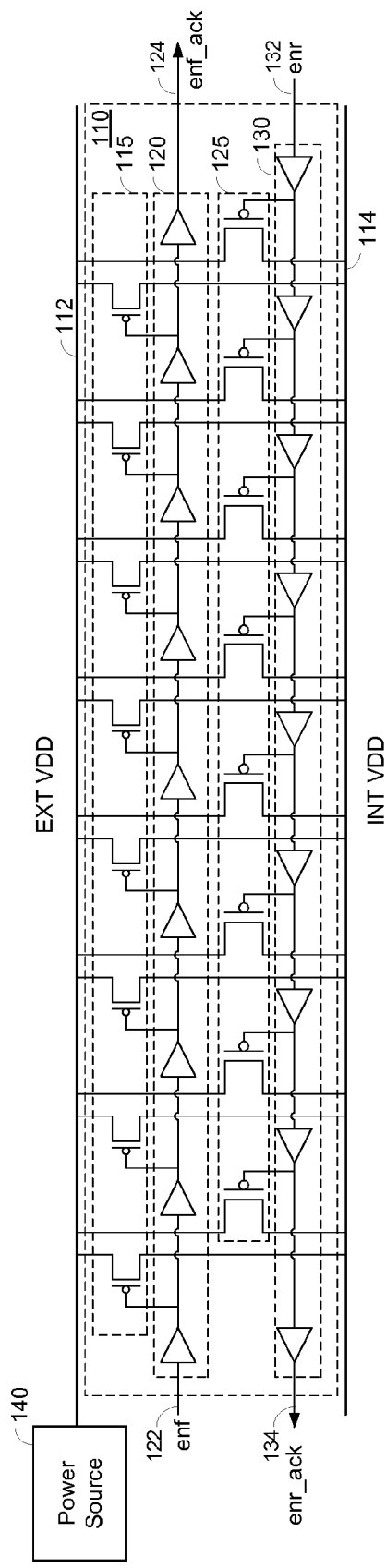
FIG. 1 shows an example of a head switch array.

FIG. 1 shows an example of a head switch array 110 coupled between an external power supply rail 112 and an internal power supply rail 114. The external supply rail 112 is coupled to an external power source 140, and the internal supply rail 114 is coupled to a circuit (not shown) that is powered by the power source 140. The circuit may comprise a CPU, GPU, a processor core, or another type of circuit. The external power source 140 may comprise a power management integrated circuit (PMIC) or other source. The power source 140 is external in the sense that the power source is external to the chip on which the circuit is fabricated. Although supply rail 112 is referred to as an external supply rail, it is to be appreciated that a portion of the supply rail may be on the chip on which the circuit is integrated. It is also to be appreciated that the internal supply rail 114 is simplified in FIG. 1 for ease of illustration, and that the actual internal supply rail 114 may comprise a power supply mesh or other structure.

The head switch array 110 is configured to selectively couple the internal supply rail 114 (and hence the circuit) to the external supply rail 112. The head switch array 110 may be used to decouple the circuit from the external supply rail 112 when the circuit is in an inactive state (e.g., sleep state), and to couple the circuit to the external supply rail when the circuit is in an active state (e.g., functional state). For example, the head switch array 110 may decouple the circuit from the external supply rail to reduce power leakage when the circuit is in the inactive state.

The head switch array 110 comprises a plurality of weak switches 115, a first delay chain 120, a plurality of strong switches 125, and a second delay chain 130. The weak and strong switches 115 and 125 may comprise p-type metal-oxide-semiconductor (PMOS) transistors, as shown in FIG. 1. The weak switches 115 may be used to limit inrush current when the circuit is powered up, and the strong switches 125 may be used to provide high-conductance paths between the external supply rail 112 and the internal supply rail 114 when the circuit is in the functional state. In this regard, the strong switches 125 may have much higher conductance when switched on (turned on) than the weak switches 115. For example, each strong switch 125 may have much larger dimensions (e.g., gate width) than a weak switch 115. The weak switches may be referred to as the "few" and the strong switches may be referred to as the "rest." It is to be appreciated that FIG. 1 is not drawn to scale, and that the strong switches 125 may be much larger relative to the weak switches 115 than shown in FIG. 1. It is also to be appreciated that the head switch array 110 may comprise a much larger number of switches (e.g., hundreds of switches) than shown in FIG. 1.

The first delay chain 120 comprises a first plurality of delay elements coupled in series, as shown in FIG. 1. The gate of each weak switch 115 is coupled to a different point along the first delay chain 120. In the example in FIG. 1, a delay element is coupled between each pair of adjacent switches 115. As discussed further below, the first delay chain 120 is configured to sequentially switch on (turn on) the weak switches 115 during power up. Each delay element in the first delay chain 120 may comprise one or more inverters and/or other logic devices with propagation delay.

The second delay chain 130 comprises a second plurality of delay elements coupled in series, as shown in FIG. 1. The gate of each strong switch 125 is coupled to a different point along the second delay chain 130. In the example in FIG. 1, a delay element is coupled between each pair of adjacent switches 125. As discussed further below, the second delay chain 130 is configured to sequentially switch on (turn on) the strong switches 125 during power up.

When the circuit is in the inactive state (e.g., sleep state), the weak and strong switches 115 and 125 are turned off, thereby decoupling the internal supply rail 114 (and hence the circuit) from the external supply rail 112. When the circuit is in the active state (e.g., function state), the weak and strong switches 115 and 125 may be turned on, thereby coupling the internal supply rail 114 (and hence the circuit) to the external supply rail 112. The strong switches 125 provide high-conductance paths between the external supply rail 112 and the internal supply rail 114 when the circuit is in the functional state.

Figure 2:
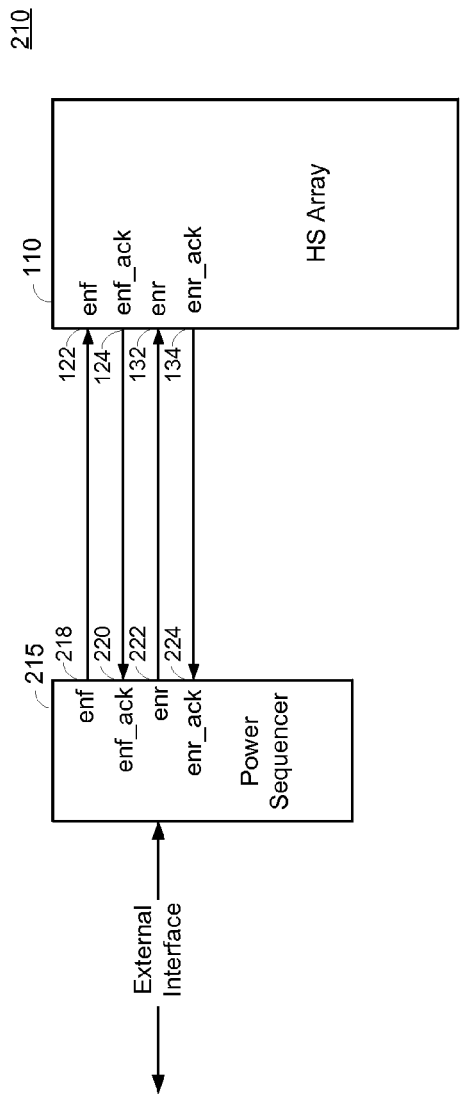
FIG. 2 shows an example of a power sequencer and a head switch array according to an embodiment of the present disclosure.

FIG. 2 shows a power-up system 210 comprising the head switch array 110 and a power sequencer 215 coupled to the head switch array 110. The power sequencer 215 is configured to power up the circuit by sequentially turning on the switches in the head switch array 110 according to a power-up sequence, as discussed further below.

To power up the circuit, the power sequencer 215 outputs, from a first output 218, a first switch enable signal (denoted "enf") to the input 122 of the first delay chain 120. As the first switch enable signal enf propagates through the first delay chain 120, the delay elements in the first delay chain 120 sequentially turn on the weak switches 115. The time delay between two adjacent weak switches is approximately equal to the delay (e.g., a few nanoseconds) of the delay element between the adjacent switches. For the example in which each weak switch comprises a PMOS transistor, the first switch enable signal enf may cause each delay element coupled to a weak switch to output a logic zero to the gate of the respective weak switch to turn on the respective weak switch.

Turning on the weak switches 115 allows current to flow from the external supply rail 112 to the internal supply rail 114. This charges capacitors in the circuit, thereby raising the voltage of the internal supply rail 114. The weak switches 115 have relatively low conductance compared with the strong switches 125. The low conductance limits the inrush current from the external supply rail 112 to the internal supply rail 114 during initial power up, thereby reducing voltage droop on the external supply rail 112.

After all of the weak switches 115 are turned on, the first switch enable signal enf propagates to the output 124 of the first delay chain 120, where the signal is output back to the power sequencer 215 as a first acknowledgement signal (denoted "enf_ack"). The power sequencer 215 receives the first acknowledgement signal enf_ack at a first acknowledgement input 220. The first acknowledgement signal enf_ack indicates to the power sequencer 215 that the weak switches 115 have been turned on. Upon receiving the first acknowledgement signal enf_ack, the power sequencer 215 may output, from a second output 222, a second switch enable signal (denoted "enr") to the input 132 of the second delay chain 130 in the head switch array 110. In some aspects, the power sequencer 215 may output the second switch enable signal enr after a predetermined time delay from receipt of the first acknowledgement signal enf_ack.

As the second switch enable signal enr propagates through the second delay chain 130, the delay elements in the second delay 130 chain sequentially turn on the strong switches 125. The time delay between two adjacent strong switches is approximately equal to the delay of the delay element between the adjacent switches. For the example in which each strong switch comprises a PMOS transistor, the second switch enable signal enr may cause each delay element coupled to a strong switch to output a logic zero to the gate of the respective strong switch to turn on the respective strong switch.

After all of the strong switches 125 are turned on, the second switch enable signal enr propagates to the output 134 of the second delay chain 130, where the signal is output back to the power sequencer 215 as a second acknowledgement signal (denoted "enr_ack"). The power sequencer 215 receives the second acknowledgment signal enr_ack at a second acknowledgement input 224. The second acknowledgement signal enr_ack indicates to the power sequencer 215 that the strong switches 125 have been turned on. Upon receiving the second acknowledgement signal enr_ack, the power sequencer 215 may output a signal to one or more other circuits via an external interface to inform the one or more other circuits that the power-up sequence for the circuit is finished.

The time delay of the first delay chain 120 may be chosen so that the voltage of the internal supply rail 114 is close to the voltage of the external supply rail 112 by the time the power sequencer 215 starts turning on the strong switches 125. For example, the time delay may be chosen so that the voltage of the internal supply rail 114 is equal to at least 90% of the voltage of the external supply rail 112. This helps ensure that turning on the strong switches 125 will not cause the voltage droop on the supply rail 112 to exceed a certain amount. However, a drawback of this approach is that the time delay of the first delay chain 120 is based on an estimate of the time it takes for the voltage of the internal supply rail 114 to reach a certain level. This time estimate may be overly conservative (e.g., include a large margin to account for process-voltage-temperature (PVT) variations), leading to a delay that is longer than necessary to prevent a large voltage droop. The long delay increases the time to power up the circuit to the active state.

To address this, embodiments of the present disclosure reduce the time to power up the circuit while keeping the voltage droop within an acceptable level. This is accomplished by comparing a voltage of the internal supply rail 114 with a voltage of the external supply rail 112 using a voltage comparator, and sending a fast-forward acknowledgement signal to the first acknowledgement input 220 of the power sequence 215 when the voltage of the internal supply rail is within a certain amount (e.g., at least 95%) of the voltage of the external supply rail. In response to the fast-forward acknowledgement signal, the power sequencer 215 sends the second switch enable signal enr to the head switch array 110 to begin switching on (turning on) the strong switches 125. The fast-forward acknowledgement signal is typically faster than the first acknowledgement signal enf_ack output by the first delay chain 120 in the head switch array 110 discussed above. As a result, the fast-forward acknowledgement signal causes the power sequencer 215 to output the second switch enable signal enr earlier, and hence the strong switches 125 to turn on earlier, thereby reducing the ramp-up time of the circuit.

Figure 3:
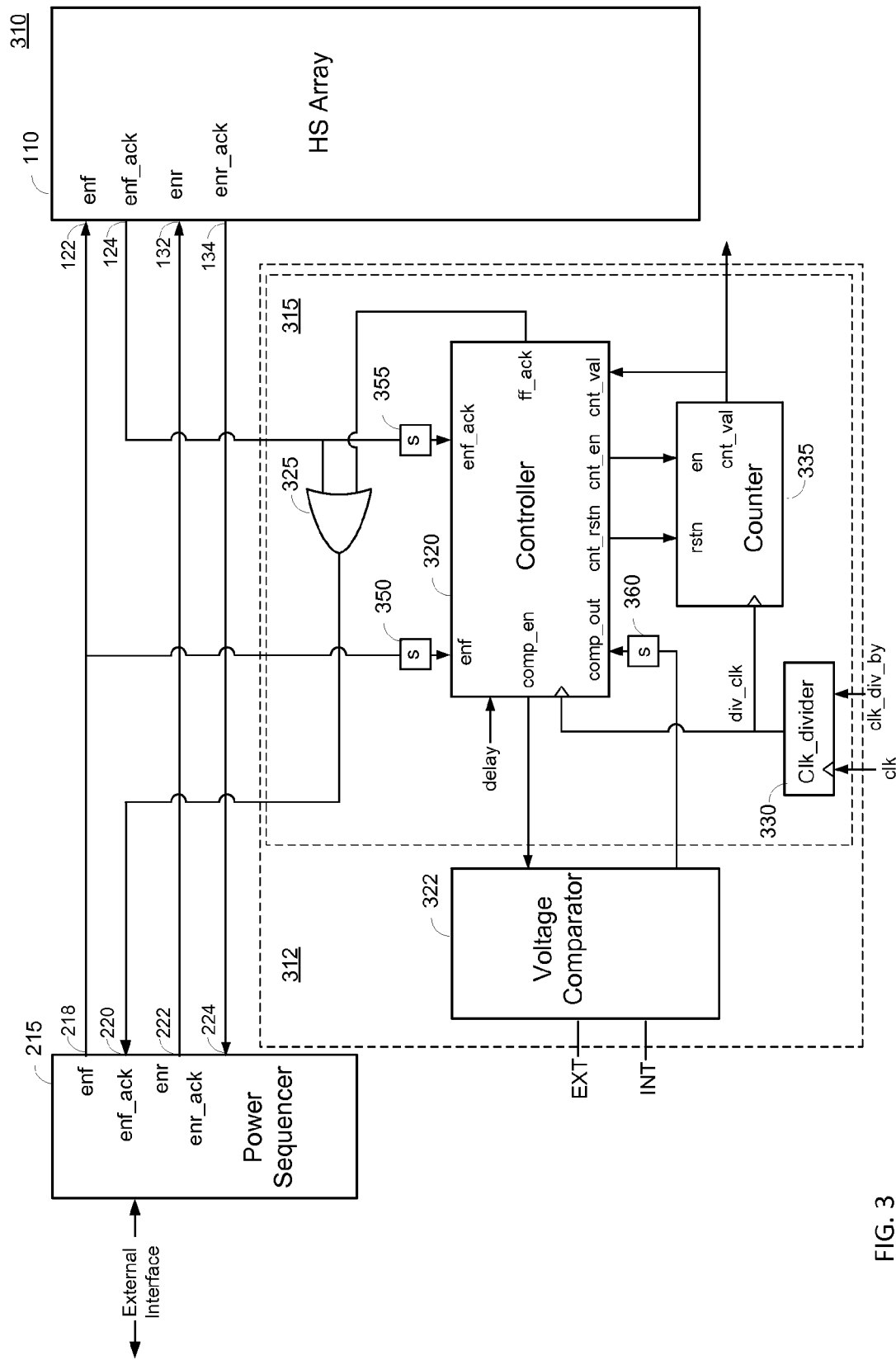
FIG. 3 shows a power-up system with a voltage comparator according to an embodiment of the present disclosure.

FIG. 3 shows a power-up system 310 according to an embodiment of the present disclosure. The power-up system 310 comprises the power sequencer 215, the head switch array 110, and a fast-forward acknowledgement circuit 312. The fast-forward acknowledgement circuit 312 further comprises a voltage comparator 322 and a control device 315.

The voltage comparator 322 may have a first input (denoted "EXT") coupled to the external supply rail 112 and a second input (denoted "INT") coupled to the internal supply rail 114. In this example, the voltage comparator 322 is configured to compare a voltage of the external supply rail 112 with a voltage of the internal supply rail 114, and to output a signal to the control device 315 based on the comparison. For example, the voltage comparator 322 may be configured to output a logic one to the control device 315 when the voltage of the internal supply rail 114 is within a certain amount (e.g., at least 95%) of the voltage of the external supply rail 112.

As shown in FIG. 3, the control device 315 has an input coupled to the first output 218 of the power sequencer 215. This allows the control device 315 to detect the first switch enable signal enf, as discussed further below. The control device 315 also has an output coupled to the first acknowledgement input 220 of the power sequencer 215. This allows the control device 315 to output a fast-forward acknowledgement to the power sequencer 215 to initiate switching of the strong switches, as discussed further below.

In operation, the control device 315 monitors the first output 218 of the power sequencer 215 for the first switch enable signal enf. When the control device 315 detects the first switch enable signal enf, the control device 315 enables the voltage comparator 322 to begin comparing the voltage of the internal supply rail 114 with the voltage of the external supply rail 112. Thus, the control device 315 enables the voltage comparator 322 when the power sequencer 215 starts power up of the circuit. Before this time, the voltage comparator 322 may be disabled to conserve power.

In response to the first switch enable signal enf, the first delay chain 120 in the head switch array 110 begins switching on (turning on) the weak switches 115. This causes the voltage of the internal supply rail 114 to ramp up. As the voltage of the internal supply rail 114 increases, the voltage comparator 322 compares this voltage with the voltage of the external supply rail 112. When the voltage of the internal supply rail 114 is within a certain amount (e.g., at least 95%) of the voltage of the external supply rail 112, the voltage comparator 322 outputs a logic one to the control device 315. In response, the control device 315 may output a fast-forward acknowledgement signal to the first acknowledgement input 220 of the power sequencer 215. The fast-forward acknowledgement signal causes the power sequencer 215 to send the second switch enable signal enr to the head switch array 110 to begin switching on (turning on) the strong switches 125. The fast-forward acknowledgement signal is typically faster than the first acknowledgement signal output by the first delay chain 120 discussed above. As a result, the fast-forward acknowledgement signal causes the power sequencer 215 to output the second switch enable signal enr earlier, and hence the strong switches 125 to begin turning on earlier, thereby reducing the ramp-up time of the circuit.

In one aspect, the control device 315 may start a counter when the output of the voltage comparator 322 initially outputs a logic one. If the voltage comparator 322 temporarily outputs a logic zero after outputting a logic one (e.g., due to a glitch on the voltage of the internal supply rail 114 and/or noise), the control device 315 may restart the counter. In this aspect, the control device 315 may output the fast-forward acknowledgement signal to the power sequencer 215 when the count value of the counter reaches a certain value. As a result, the control device 315 outputs the fast-forward acknowledgement when the output of the voltage comparator 322 is steady at logic one for a period of time.

In the example in FIG. 3, the control device 315 further comprises a controller 320, an OR gate 325, a clock divider 330, a counter 335, a first synchronizer 350, a second synchronizer 355, and a third synchronizer 360.

The clock divider 330 is configured to receive a clock (denoted "clk") and to divide the frequency of the clock clk to generate a divided clock (denoted "div_clk"). The amount by which the clock divider 330 divides the frequency of the clock clk may be programmed by input bits (denoted "clk_div_by"). In other words, the divisor of the clock divider 330 may be controlled by the values of the input bits clk_div_by. The divided clock div_clk is input to the controller 320 and the counter 335 to time the operations of the controller 320 and the counter 335, as discussed further below. In one aspect, the clock clk may be a high-frequency clock (e.g., in the GHz range) that is also used to time operations of one or more processor cores. In this aspect, the controller 320 and counter 335 may not require a high-frequency clock to function properly. As a result, the clock divider 330 may slow down the clock clk (e.g., to the MHz range) by dividing the frequency of the clock clk, and output the reduced-speed clock (i.e., divided clock div_clk) to the controller 320 and the counter 335. The slower clock speed may increase reliability of the controller 320 and 335 and/or simplify the structures of the controller 320 and counter 335 (e.g., allow the use of a lower-bit counter). It is to be appreciated that the clock divider 330 may be omitted, in which case the clock clk may be directly input to the controller 320 and the counter 335.

The first synchronizer 350 is coupled between the first output 218 of the power sequencer 215 and the controller 320. The first synchronizer 350 is configured to synchronize the first switch enable signal enf from the power sequencer 215 with the divided clock div_clk before inputting the first switch enable signal enf to the controller 320. In other words, when the power sequencer 215 outputs the first switch enable signal enf, the first synchronizer 350 aligns the edge of the switch enable signal enf with an edge of the divided clock div_clk before inputting the switch enable signal enf to the controller 320. The second synchronizer 355 is coupled between the output 124 of the first delay chain 120 and the controller 320. The second synchronizer 355 is configured to synchronize the first acknowledgement signal enf_ack from the first delay chain 120 with the divided clock div_clk before inputting the first acknowledgement signal enf_ack to the controller 320. The third synchronizer 360 is coupled between the output of the voltage comparator 322 and the controller 320. The third synchronizer 360 is configured to synchronize the comparator output signal with the divided clock div_clk before inputting the comparator output signal to the controller 320.

The OR gate 325 has a first input coupled to the output 124 of the first delay chain 120, a second input coupled to a fast-forward acknowledgement output (denoted "ff-ack") of the controller 320, and an output coupled to the first acknowledgement input 220 of the power sequencer 215.

In operation, the controller 320 monitors the first output 218 of the power sequencer 215 for the first switch enable signal enf. When the controller 320 detects the first switch enable signal enf, the controller 320 enables the voltage comparator 322 to begin comparing the voltage of the internal supply rail 114 with the voltage of the external supply rail 112. Before this time, the voltage comparator 322 may be disabled to conserve power.

In response to the first switch enable signal enf, the first delay chain 120 in the head switch array 110 begins switching on (turning on) the weak switches 115. This causes the voltage of the internal supply rail 114 to ramp up. As the voltage of the internal supply rail 114 increases, the voltage comparator 322 compares this voltage with the voltage of the external supply rail 112. When the voltage of the internal supply rail 114 is within a certain amount (e.g., at least 95%) of the voltage of the external supply rail 112, the voltage comparator 322 outputs a logic one to the controller 320.

In response, the controller 320 may enable the counter 335 to start counting. If the voltage comparator 322 temporarily outputs a logic zero after outputting a logic one (e.g., due to a glitch on the voltage of the internal supply rail 114 and/or noise), the controller 320 may disable and reset the counter 335. The controller 320 may then enable the counter 335 when the voltage comparator output becomes one again. While the counter 335 counts, the controller 320 may monitor the count value of the counter (denoted "cnt_val"). When the count value reaches a certain value, the controller 320 may output the fast-forward acknowledgement signal to the OR gate 325, which passes the fast-forward acknowledgement signal to the first acknowledgement input 220 of the power sequencer 215, as discussed further below. As a result, the controller 320 outputs the fast-forward acknowledgement signal when the comparator output is steady at logic one for a period of time. In one aspect, the period of time (which corresponds to a particular count value) may be set by input bits (denoted "delay") to the controller 320. Thus, the period of time may be programmable. After sending the fast-forward acknowledgement signal, the controller 320 may disable the voltage comparator 322 until the next power-up cycle to conserve power.

In one aspect, the counter 335 may continue counting after the fast-forward acknowledgement signal is sent. In this aspect, the controller 320 may monitor the output 124 of the first delay chain 120 in the head switch array 110 for the first acknowledgement signal enf_ack. When the controller 320 detects the first acknowledgement signal enf_ack, the controller 320 may record the count value of the counter 335. The controller 320 may then determine the difference between this count value and the count value at which the fast-forward acknowledgement signal was sent. The difference in the count values indicates the time by which the fast-forward acknowledgement circuit 312 accelerates output of the second switch enable signal enr by the power sequencer 215. After the first acknowledgement signal enf_ack is received, the controller 320 may disable and reset the counter 335 for the next power-up cycle.

As discussed above, when the controller 320 outputs the fast-forward acknowledgement signal, the OR gate 325 passes the fast-forward acknowledgement signal to the first acknowledgement input 220 of the power sequencer 215. In this example, the fast-forward acknowledgement signal and the first acknowledge signal enf_ack may both have a logic value of one. As a result, the OR gate 325 passes the acknowledgement signal that arrives first at the OR gate 325 to the first acknowledgement input 220 of the power sequencer 215. Assuming the fast-forward acknowledgement signal is ahead of the first acknowledgement signal enf_ack (and hence arrives first at the OR gate 325), the OR gate 325 passes the fast-forward acknowledgement signal to the power sequencer 215. In one aspect, the controller 320 may be disabled, for example, if the controller 320 is not functioning properly. In this aspect, the controller 320 may continuously output a logic zero to the OR gate 325 while disabled. As a result, the OR gate 325 passes the first acknowledgement signal enf_ack from the head switch array 110 to the power sequencer 215. In this case, the power-up system 310 in FIG. 3 operates in a similar manner as the power-up system 210 in FIG. 2.

Figure 4:
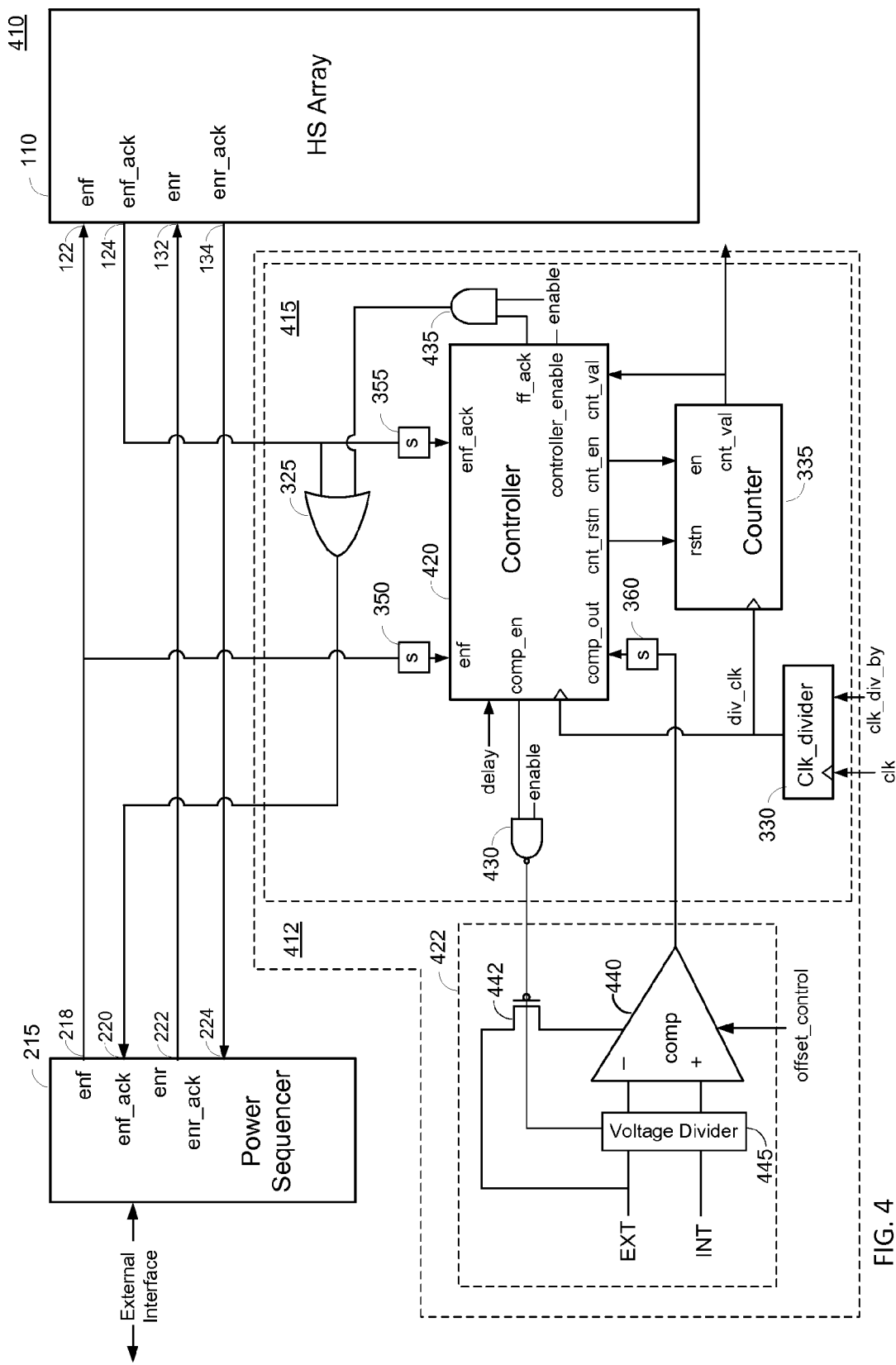
FIG. 4 shows a power-up system with an analog voltage comparator according to an embodiment of the present disclosure.

FIG. 4 shows a power-up system 410 according to another embodiment of the present disclosure. The power-up system 410 comprises the power sequencer 215, the head switch array 110, and a fast-forward acknowledgement circuit 412. The fast-forward acknowledgement circuit 412 further comprises an analog voltage comparator 422 and a control device 415. The control device 415 is similar to the control device 315 in FIG. 3 with additional logic for selectively enabling the fast-forward acknowledgement circuit 412, as discussed further below.

The analog voltage comparator 422 comprises a comparing amplifier 440, an enable switch 442, and a voltage divider 445. The voltage comparator 422 has a first input (denoted "EXT") coupled to the external supply rail 112 and a second input (denoted "INT") coupled to the internal supply rail 114. In this example, the enable switch 442 is coupled between the first input EXT and the supply input of the comparing amplifier 440. When the enable switch 442 is turned on, the enable switch 442 couples the voltage of the external supply rail 112 to the supply input of the comparing amplifier 440 to power the comparing amplifier 440. When the enablement switch 442 is turned off, the comparing amplifier 440 is disabled. In the example in FIG. 4, the enable switch 442 comprises a PMOS transistor. In this example, the enable switch 442 is turned on by applying a logic zero to the gate of the enable switch 442, and the enable switch 442 is turned off by applying a logic one to the gate of the enable switch 442.

The voltage divider 445 is configured to scale down the voltage of the external supply rail 112 before inputting the voltage of the external supply rail 112 to the minus (−) input of the comparing amplifier 440. Similarly, the voltage divider 445 is configured to scale down the voltage of the internal supply rail 114 before inputting the voltage of the internal supply rail 114 to the plus (+) input of the comparing amplifier 440. The voltages of the external and internal supply rails are scaled down to prevent the comparing amplifier 440 from going into saturation. This is because the voltage of the external supply rail 112 is also used to power the comparing amplifier 440. In one example, the voltage divider 445 may scale down the voltages of the external and internal supply rails by approximately 50 percent. In this example, the voltage of the external supply rail 112 is reduced approximately in half (e.g., ½ EXT VDD) before being input to the minus (−) input of the comparing amplifier 440.

The comparing amplifier 440 may comprise a signal-output differential amplifier. In one aspect, the comparing amplifier 440 may be configured to output a logic one when the voltage at the plus (+) input is greater than the voltage at the minus (−) input, and output a logic zero when the voltage at the plus (+) input is less than the voltage at the minus (−) input. In this aspect, the voltage divider 445 may scale down the voltage of the external supply rail 112 by a slightly greater amount than the voltage of the internal supply rail 114 so that the comparing amplifier 440 outputs a logic one when the voltage of the internal supply rail 114 is within a certain amount (e.g., at least 95%) of the voltage of the external supply rail 112. For example, the voltage divider 445 may scale both voltages by 50% to avoid saturating the comparing amplifier 440. The voltage divider 445 may further scale down the voltage of the external supply rail by an additional 5%. As a result, the voltages at the inputs of the comparing amplifier 440 are approximately equal when the voltage of the internal supply rail 114 is approximately equal to 95% of the voltage of the external supply rail 112. In this example, the comparing amplifier 440 outputs a logic one to the control device 415 when the voltage of the internal supply rail 114 reaches 95% of the voltage of the external supply rail 112.

In one aspect, the comparing amplifier 440 may include an offset control input (denoted "offset_control") for adjusting the input offset of the comparing amplifier 440. Typically, a comparing amplifier has an input offset due to mismatches between components in the comparing amplifier 440. This causes the comparing amplifier 440 to transition from logic zero to logic one when the inputs of the comparing amplifier 440 are offset by a certain amount instead of when they are equal. Conventionally, the input offset is adjusted to be close to zero so that the comparing amplifier 440 transitions from logic zero to logic when the inputs of the comparing amplifier 440 are approximately equal. In one example, the input offset of the comparing amplifier 440 may be adjusted to be close to zero.

In another example, the input offset of the comparing amplifier 440 may be intentionally adjusted to a value that causes the comparing amplifier 440 to transition from logic zero to logic one when the voltage of the internal supply rail 114 is within a certain amount (e.g., at least 95%) of the voltage of the external supply rail 112. Thus, the internal-supply voltage at which the comparing amplifier 440 outputs a logic one may be adjusted by adjusting the input offset of the comparing amplifier 440. In this example, the voltage divider 445 may scale down the voltages of the external and internal supply rails by approximately the same amount (e.g., 50 percent).

Therefore, the internal-supply voltage at which the comparing amplifier 440 outputs a logic one may be adjusted by adjusting the amounts by which the voltage divider scales down the voltages of the external and internal supply rails and/or adjusting the input offset of the comparing amplifier 440.

The output of the comparing amplifier 440 may make multiple transitions between one and zero when the voltage of the internal supply rail 142 is close to the threshold voltage of the comparing amplifier due to noise. The threshold voltage may correspond to a certain percentage (e.g., 95%) of the voltage of the external supply rail. In one aspect, the comparing amplifier 440 may include hysteresis to prevent the multiple transitions. The hysteresis causes the comparing amplifier to transition from zero to one when the internal-supply voltage reaches a first value slightly above the threshold and transition from one to zero when the internal-supply voltage falls below a second value slightly below the threshold. The first and second values may be programmable. In another aspect, hysteresis may be omitted from the comparing amplifier 440. This is because the controller 420 may effectively filter out multiple transitions by waiting until the comparator output stays at logic one for a period of time before sending the fast-forward acknowledgement signal.

As discussed above, the control device 415 is similar to the control device 315 in FIG. 3 with additional logic for selectively enabling the fast-forward acknowledgement circuit 412. In one aspect, the fast-forward acknowledgement circuit 412 is selectively enabled according to the logic state of a main enable signal (denoted "enable"). When the main enable signal is logic one, the fast-forward acknowledgement circuit 412 is enabled, and, when the main enable signal is logic zero, the fast-forward acknowledgement circuit 412 is disabled.

In the example in FIG. 4, the control device 415 includes a NAND gate 430 and an AND gate 435. In this example, the NAND gate 430 has a first input coupled to a comparator enable output (denoted "comp_en") of the controller 420, a second input coupled to the main enable signal, and an output coupled to the gate of the enable switch 442 in the analog comparator 422. When the main enablement signal is logic zero, the NAND gate 430 outputs a logic one to the gate of the enable switch 442 regardless of the logic state of the comparator enable output comp_en of the controller 420. As a result, the enable switch 442 (a PMOS transistor in the example in FIG. 4) is turned off, disabling the comparator amplifier 440. Also, the voltage divider 445 may be configured to be disabled when the output of the NAND gate 430 is logic one.

When the main enablement signal is logic one, the NAND gate 430 acts as an inverter that inverts the logic state of the comparator enable output comp_en of the controller 420. In this example, the controller 420 may enable the analog voltage comparator 422 by outputting a logic one at the comparator enable output comp_en. The NAND gate 430 inverts the logic one to a logic zero, which is applied to the gate of the enable switch 442 (a PMOS transistor in the example in FIG. 4). This turns on the enable switch 442, thereby enabling the comparing amplifier 440.

The AND gate 435 has a first input coupled to the fast-forward acknowledgement output (denoted "ff_ack") of the controller 420, a second input coupled to the main enable signal, and an output coupled to the second input of the OR gate 325. When the main enable signal is logic zero, the AND gate 435 outputs a logic zero to the OR gate 325 regardless of the logic state at the fast-forward acknowledgement output ff_ack of the controller 420. As a result, the OR gate 325 passes the first acknowledgement signal enf_ack from the head switch array 110 to the power sequencer 215. Thus, when the fast-forward acknowledgement circuit 412 is disabled, the power-up system 410 in FIG. 4 operates in a similar manner as the power-up system 210 in FIG. 2. When the main enable signal is logic one, the AND gate 435 passes the fast-forward acknowledgement signal from the controller 420 to the OR gate 325, which, in turn, passes the fast-forward acknowledgement signal to the power sequencer 215, as discussed above.

The controller 420 may also include an enable input (denoted "controller_enable") coupled to the main enable signal. In this example, the controller 420 may be enabled when the main enable signal is logic one, and disabled when the main enable signal is logic zero.

When enabled by the main enable signal, the controller 420 may function in a similar manner as the controller 320 in FIG. 3. In this regard, the controller 420 monitors the first output 218 of the power sequencer 215 for the first switch enable signal enf. When the controller 420 detects the first switch enable signal enf, the controller 420 enables the voltage comparator 422 to begin comparing the voltage of the internal supply rail 114 with the voltage of the external supply rail 112.

In response to the first switch enable signal enf, the first delay chain 120 in the head switch array 110 begins switching on (turning on) the weak switches 115. This causes the voltage of the internal supply rail 114 to ramp up. As the voltage of the internal supply rail 114 increases, the voltage comparator 422 compares this voltage with the voltage of the external supply rail 112. When the voltage of the internal supply rail 114 is within a certain amount (e.g., at least 95%) of the voltage of the external supply rail 112, the voltage comparator 422 outputs a logic one to the controller 420.

In response, the controller 420 may enable the counter 335 to start counting. If the voltage comparator 422 temporarily outputs a logic zero after outputting a logic one (e.g., due to a glitch on the voltage of the internal supply rail 114 and/or noise), the controller 420 may disable and reset the counter 335. The controller 420 may then enable the counter 335 when the voltage comparator output becomes one again. While the counter 335 counts, the controller 420 may monitor the count value of the counter (denoted "cnt_val"). When the count value reaches a certain value, the controller 420 may output the fast-forward acknowledgement signal to the AND gate 435. The AND gate 435 passes the fast-forward acknowledgement signal to the OR gate 325, which, in turn, passes the fast-forward acknowledgement signal to the first acknowledgement input 220 of the power sequencer 215. In response to the fast-forward acknowledgement signal, the power sequencer 215 launches the second switch enable signal enr to begin switching on (turning on) the strong switches 125 in the head switch array 110. The controller 420 may also disable the voltage comparator 422 to conserve power.

Figure 5:
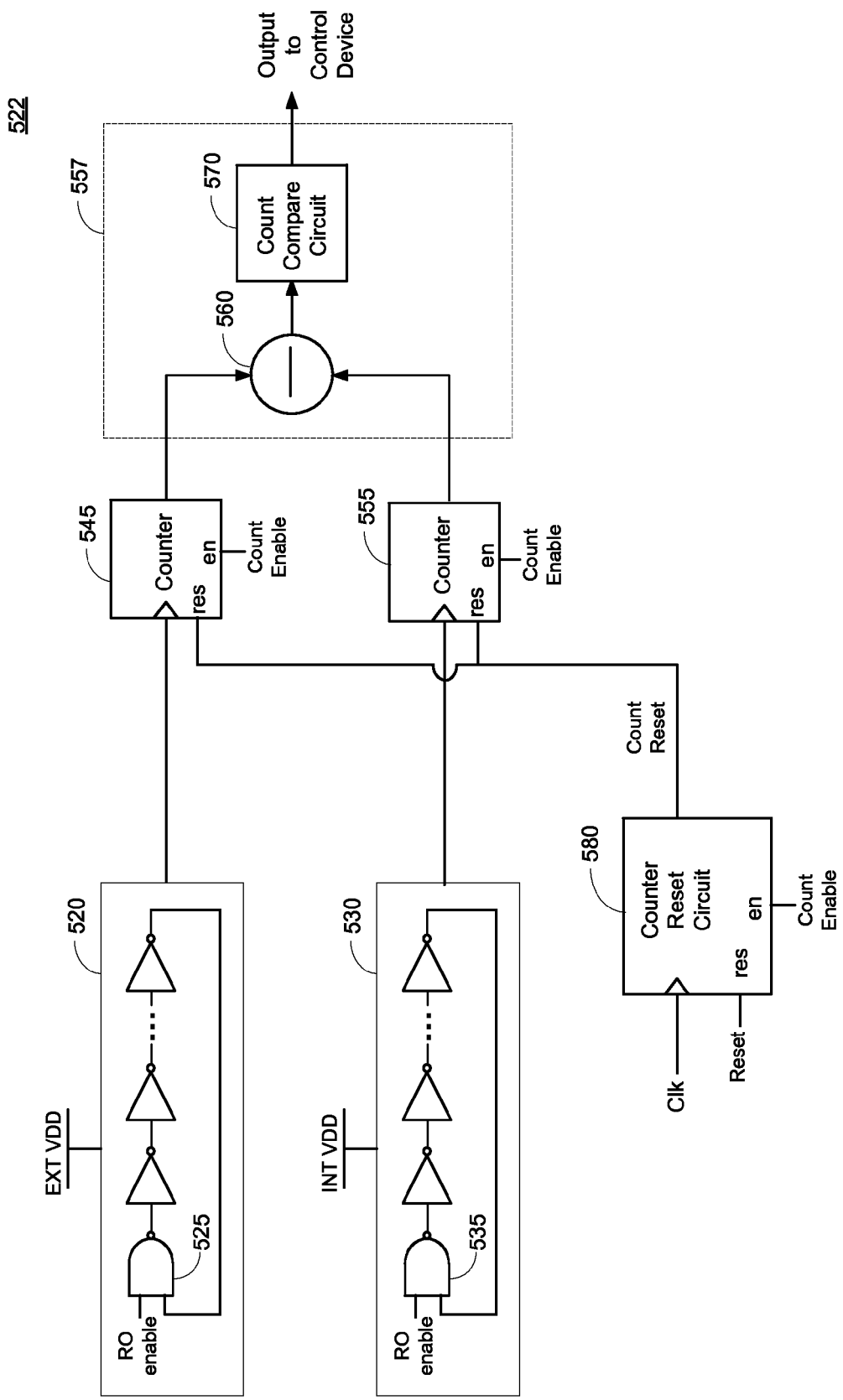
FIG. 5 shows a digital voltage comparator according to an embodiment of the present disclosure.

FIG. 5 shows a digital voltage comparator 522 according to an embodiment of the present disclosure. The digital voltage comparator 522 may be used to implement the voltage comparator 322 in FIG. 3. The digital voltage comparator 522 may also be used in place of the analog voltage comparator 422 in FIG. 4. In the example in FIG. 5, the digital voltage comparator 522 comprises a first ring oscillator 520, a second ring oscillator 530, a first counter 545, a second counter 555, a compare circuit 557, and a counter reset circuit 580.

The first ring oscillator 520 comprises a first NAND gate 525, and a first plurality of inverters coupled in series to form a first inverter chain. The first NAND gate 525 has a first input coupled to the output of the last inverter in the first inverter chain, a second input coupled to a ring oscillator (RO) enable signal (denoted "RO enable"), and an output coupled to the input of the first inverter in the first inverter chain. When the RO enable signal is logic one, the first NAND gate 525 acts as an inverter between the last inverter in the first inverter chain and the first inverter in the first inverter chain. As a result, the first NAND gate 525 and the first inverter chain form an inverter loop that causes the first ring oscillator 520 to oscillate, assuming the number of inversions in the loop is odd. When the RO enable signal is logic zero, the output of the first NAND gate 525 remains static at logic one. As a result, the first ring oscillator 520 does not oscillate (and hence is disabled) when the RO enable signal is logic zero. Thus, the first NAND gate 525 allows the first ring oscillator 520 to be selectively enabled by the control device 315 or 415. It is to be appreciated that the present disclosure is not limited to a NAND gate, and that another type of logic gate may be used to selectively enable the first ring oscillator 520.

The first NAND gate 525 and the inverters in the first ring oscillator 520 are powered by a voltage of the external supply rail 112 (denoted "EXT VDD"). As a result, when the first ring oscillator 520 is enabled, the output frequency of the first ring oscillator 520 is a function of the voltage of the external supply rail 112. In this respect, the first ring oscillator 520 may be considered a voltage-controlled oscillator controlled by EXT VDD. Thus, the output frequency of the first ring oscillator 520 provides an indication of the voltage level of the external supply rail 112.

The second ring oscillator 530 comprises a second NAND gate 535, and a second plurality of inverters coupled in series to form a second inverter chain. The second NAND gate 535 has a first input coupled to the output of the last inverter in the second inverter chain, a second input coupled to the RO enable signal, and an output coupled to the input of the first inverter in the second inverter chain. When the RO enable signal is logic one, the second NAND gate 535 and the second inverter chain form an inverter loop that causes the second ring oscillator 530 to oscillate. When the RO enable signal is logic zero, the output of the second NAND gate 535 remains static at logic one. As a result, the second ring oscillator 530 does not oscillate (and hence is disabled) when the RO enable signal is logic zero.

The second NAND gate 535 and the inverters in the second ring oscillator 530 are powered by a voltage of the internal supply rail 114 (denoted "INT VDD"). As a result, when the second ring oscillator 530 is enabled, the output frequency of the second ring oscillator 530 is a function of the voltage of the internal supply rail 114. In this respect, the second ring oscillator 530 may be considered a voltage-controlled oscillator controlled by INT VDD. Thus, the output frequency of the second ring oscillator 530 provides an indication of the voltage level of the internal supply rail 114. In one aspect, the output frequency of each of the ring oscillators 520 and 530 may be approximately a linear function of the respective voltage.

The first counter 545 has a clock input coupled to the output of the first ring oscillator 520. The first counter 545 is configured to count a number of cycles (periods) of the output of the first ring oscillator 520. Thus, the first counter 545 translates the output frequency of the first ring oscillator 520 into a count value. Since the output frequency of the first ring oscillator 520 is a function of the voltage of the external supply rail 112, the count value of the first counter 545 is also a function of the voltage of the external supply rail 112, and is therefore indicative of the voltage level of the external supply rail 112. The first counter 545 also includes a reset input (denoted "res") to selectively reset the count value of the counter 545, and an enable input (denoted "en") to selectively enable the counter 545.

The second counter 555 has a clock input coupled to the output of the second ring oscillator 530. The second counter 555 is configured to count a number of cycles (periods) of the output of the second ring oscillator 530. Thus, the second counter 555 translates the output frequency of the second ring oscillator 530 into a count value. Since the output frequency of the second ring oscillator 530 is a function of the voltage of the internal supply rail 114, the count value of the second counter 555 is also a function of the voltage of the internal supply rail 114, and is therefore indicative of the voltage level of the internal supply rail 114. The second counter 555 also includes a reset input (denoted "res") to selectively reset the count value of the counter 555, and an enable input (denoted "en") to selectively enable the counter 555.

The compare circuit 557 is coupled to the outputs of the first and second counters 545 and 555. The compare circuit 557 is configured to determine a count difference between the count values of the first and second counters 545 and 555. Since the count value of the first counter 545 is indicative of the voltage of the external supply rail 112 and the count value of the second counter 555 is indicative of the voltage of the internal supply rail 114, the count difference is indicative of the voltage difference between the external supply rail 112 and the internal supply rail 114. Thus, the count difference may be used to determine when the voltage of the internal supply rail 114 is within a certain amount (e.g., 95%) of the voltage of the external supply rail 112. In this regard, the compare circuit 557 may be configured to determine that the voltage of the internal supply rail 114 is within a certain amount (e.g., 95%) of the voltage of the external supply rail 112 when the count difference is less than a threshold count value, and output a logic one to the control device when the count difference is less than the threshold count value.

In the example in FIG. 5, the compare circuit 557 comprises a subtractor 560 and a count compare circuit 570. The subtractor 560 is configured to subtract the count value of the second counter 555 from the count value of the first counter 545, and output the resulting count difference to the count compare circuit 570. The count difference is indicative of the voltage difference between the external supply rail 112 and the internal supply rail 114, as discussed above.

The count compare circuit 570 is configured to compare the count difference from the subtractor 560 with the threshold count value, and output a signal to the control device 315 or 415 based on the comparison. The threshold count value may be programmable. In one example, the threshold count value may be set such that the count difference is less than the threshold count value when the voltage of the internal supply rail 114 is within a certain amount (e.g., at least 95%) of the voltage of the external supply rail 112. In this example, the count compare circuit 570 may output a logic zero when the count difference is above the threshold count, and output a logic one when the count difference is below the threshold count, as discussed further below.

The counter reset circuit 580 is configured to periodically reset the first and second counters 545 and 555. In this regard, the counter reset circuit 580 receives an input clock Clk, and resets the first and second counters 545 and 555 every Mth cycle (period) of the input clock Clk, where M is an integer. The input clock Clk may be the same as the clock input to the frequency divider 330 or another clock. Thus, the count values of the first and second counters 545 and 555 are reset to zero every M cycles of the input clock Clk. This is done because the output frequency of the second ring oscillator 530 increases as the voltage of the internal supply rail 114 increases during ramp up. Resetting the count values periodically helps ensure that the count value of the second counter 555 provides an accurate indication of the current output frequency of the second ring oscillator, and hence the current voltage level of the internal supply rail 114. The counter reset circuit 580 may also comprise a reset input (denoted "res") to selectively reset the counter reset circuit 580, and an enable input (denoted "en") to selectively enable the counter reset circuit 580.

Operations of the digital voltage comparator 522 during power up will now be described according to embodiments of the present disclosure. Before the start of power up, the control device 315 or 415 monitors the first output 218 of the power sequencer 215 for the first switch enable signal enf. When the control device 315 or 415 detects the first switch enable signal enf, the control device 315 or 415 enables the voltage comparator 522 to begin comparing the voltage of the internal supply rail 114 with the voltage of the external supply rail 112. In the example in FIG. 5, the control device 315 or 415 may enable the first and second ring oscillators 520 and 530 by causing the RO enable signal to have a logic state of one, and enable the first and second counters 545 and 555 and the counter reset circuit 580 by causing the count enable signal to have a logic state of one.

In response to the first switch enable signal enf, the first delay chain 120 in the head switch array 110 begins switching on (turning on) the weak switches 115. Initially the voltage of the internal supply rail 114 is low. As a result, the output frequency of the second ring oscillator 530 (which is powered by the internal supply rail 114) is initially much slower than the output frequency of the first ring oscillator 520 (which is powered by the external supply rail 112). Thus, the count difference is initially much larger than the threshold count value, causing the count compare circuit 570 to output a logic zero to the control device 315 or 415.

Over time the voltage of the internal supply rail 114 increases. As a result, the output frequency of the second ring oscillator 530 increases (speeds up) over time, causing the count difference to decease over time. Eventually, the count difference falls below the threshold count, indicating that the voltage of the internal supply rail 114 is within a desired amount (e.g., at least 95%) of the voltage of the external supply rail 112. When this occurs, the voltage comparator 522 may output a logic one to the control device 315 or 415.

In response, the control device 315 or 415 may output the fast-forward acknowledgement signal to the power sequencer 215 to initiate switching of the strong switches 125 in the head switch array 110. In one aspect, the control device 315 or 415 may wait for the output of the comparator 522 to stay at logic one for a period of time (as measured by the counter 335) before sending the fast-forward acknowledgement signal. After sending the fast-forward acknowledgement signal, the control device 315 or 415 may disable the rings oscillators 520 and 530, the counters 545 and 555, and the counter reset circuit 580 until the next power up cycle to conserve power. The control device 315 or 415 may also reset the counter reset circuit 580.

In one aspect, operations of the subtractor 560 and the count compare circuit 570 may be timed using the clock Clk. In this aspect, the subtractor 560 may compute the count difference every cycle of the clock Clk. This may cause a glitch since the counters 545 and 555 run in different clock domains. More particularly, the first counter 545 is clocked using the output of the first ring oscillator 520, and the second counter 555 is clocked using the output of the second ring oscillator 530. In this aspect, the count compare circuit 570 may filter out glitch by outputting a logic one to the control device 315 or 415 when K consecutive count differences from the subtractor 560 are below the threshold, where K is an integer (i.e., count differences are below the threshold for K continuous cycles of the clock Clk). K may be equal to eight or another number. Once the count compare circuit 570 outputs logic one, the count compare circuit 570 may continue outputting logic one for as long as consecutive count differences from the subtractor 560 are below the threshold.

In one embodiment, the count compare circuit 570 may have a wait counter that tracks the number of times consecutive count differences from the subtractor 560 are below the threshold. In this embodiment, each time a count difference is below the threshold and the previous count difference is above the threshold, the count compare circuit 570 may start incrementing the wait counter. Each time a count difference is below the threshold and the previous count difference is below the threshold, the count compare circuit 570 may increment the wait counter. Each time a count difference is above the threshold, the count compare circuit 570 may reset the wait counter if the previous count difference is below the threshold or keep the wait counter at zero if the previous count difference is above the threshold. The count compare circuit 570 may output logic one when the wait counter reaches K, indicating that K consecutive count differences are below the threshold. Once the count compare circuit 570 outputs logic one, the count compare circuit 570 may continue outputting logic one for as long as consecutive count differences from the subtractor 560 are below the threshold.

Figure 6:
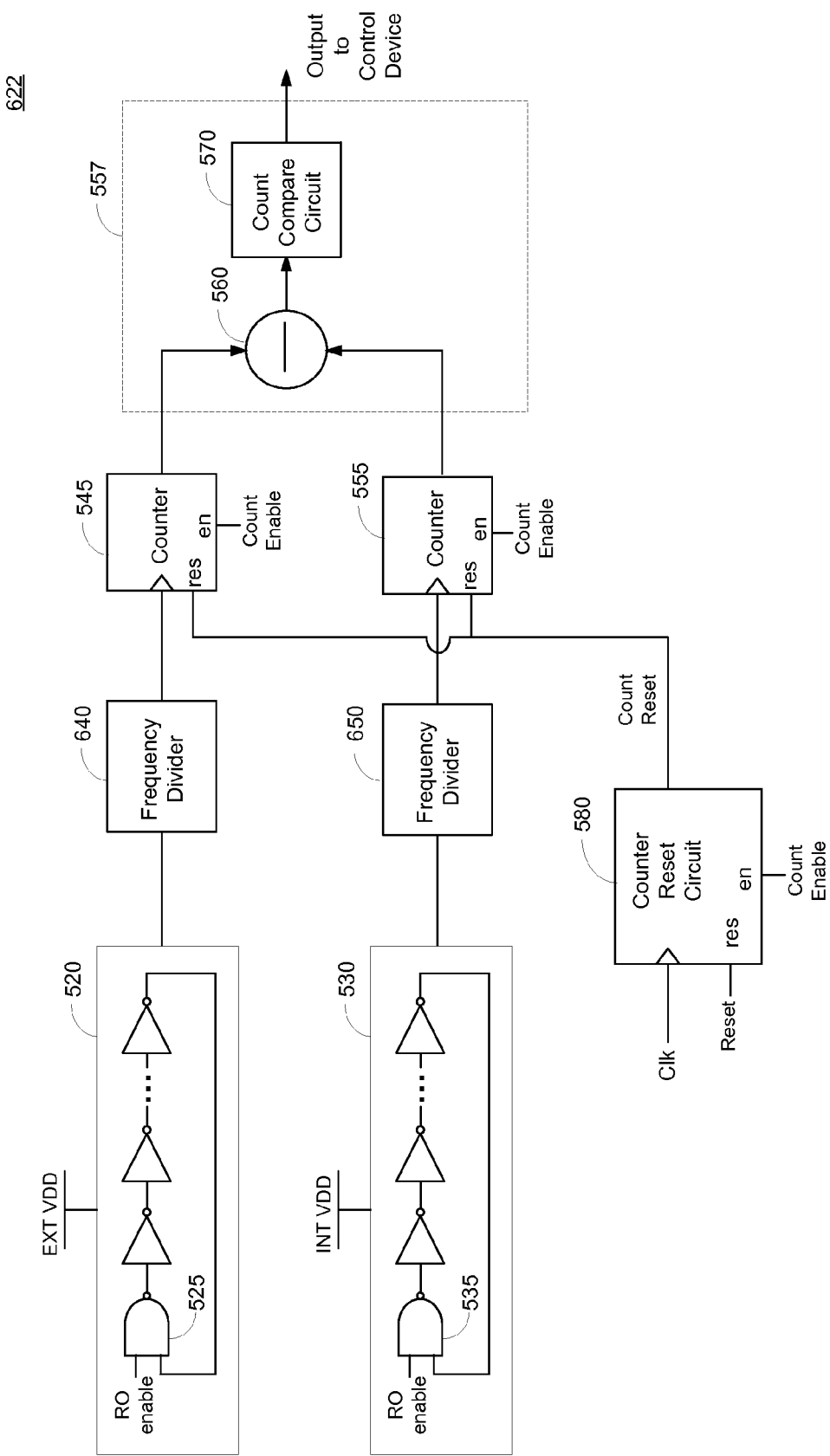
FIG. 6 shows a digital voltage comparator comprising frequency dividers according to an embodiment of the present disclosure.

In one embodiment, the output frequency of the first ring oscillator 520 may be relatively high (e.g., hundreds of MHz), making it more difficult to implement the first counter 545. To address this, the frequency of the output signal of the first ring oscillator 520 may be reduced (slowed down) before going to the first counter 545. In this regard, FIG. 6 shows an example of the digital voltage comparator 622 in which a first frequency divider 640 is inserted between the output of the first ring oscillator 520 and the clock input of the first counter 545. The first frequency divider 640 reduces the frequency of the output signal of the first ring oscillator 520 before the output signal is input to the first counter 545. For example, the first frequency divider 640 may divide the frequency of the output signal by four or another value. The digital voltage comparator 622 may also comprise a second frequency divider 650 between the output of the second ring oscillator 530 and the clock input of the second counter 555. The second frequency divider 650 may reduce the frequency of the output signal of the second ring oscillator 530 by the same amount as the frequency of the output signal of the first oscillator 520.

Figure 7:
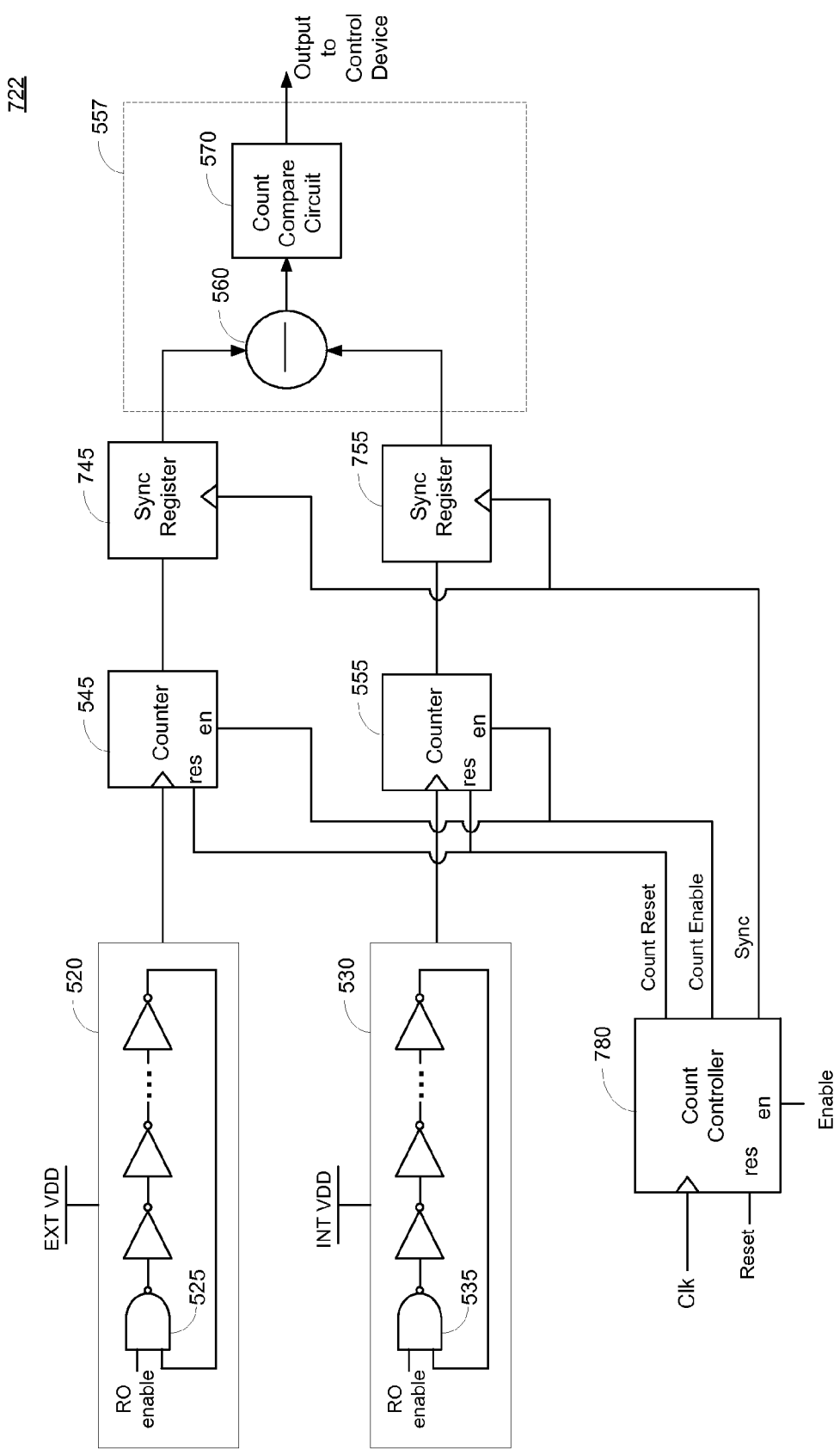
FIG. 7 shows a digital voltage comparator according to another embodiment of the present disclosure.

FIG. 7 shows a digital voltage comparator 722 according to an embodiment of the present disclosure. The digital voltage comparator 722 includes a first synchronous register 745 between the output of the first counter 545 and the subtractor 560, and a second synchronous register 755 between the output of the second counter 555 and the subtractor 560. The digital voltage comparator 722 further includes a count controller 780 configured to control the counters 545 and 555 and the synchronous registers 745 and 755 to reduce glitch in the comparator 722, as discussed further below.

The count controller 780 receives an input clock (denoted "Clk"), which may be the same as the clock input to the frequency divider 330 or another clock. In operation, the count controller 780 periodically outputs a count reset signal to the first and second counters 545 and 555 to reset their count values. The count controller 780 also selectively enables the first and second counter 545 and 555 using a count enable signal. As discussed further below, the count controller 780 periodically disables the first and second counters 545 and 555 between resets for a short time interval to temporarily hold the count values of the first and second counter 545 and 555. The count controller 780 also periodically outputs a sync signal to the synchronous registers 745 and 755 when the counters 545 and 555 are disabled. This causes each synchronous register 745 and 755 to read the count value of the respective counter 545 and 555, and output the count value to the subtractor 560. Since both synchronous registers 745 and 755 are timed by the same sync signal, the outputs of the synchronous registers 745 and 755 are approximately synchronous. This reduces glitch in the subtractor 560 caused by asynchronous signals being input to the subtractor 560, as discussed further below.

Figure 8:
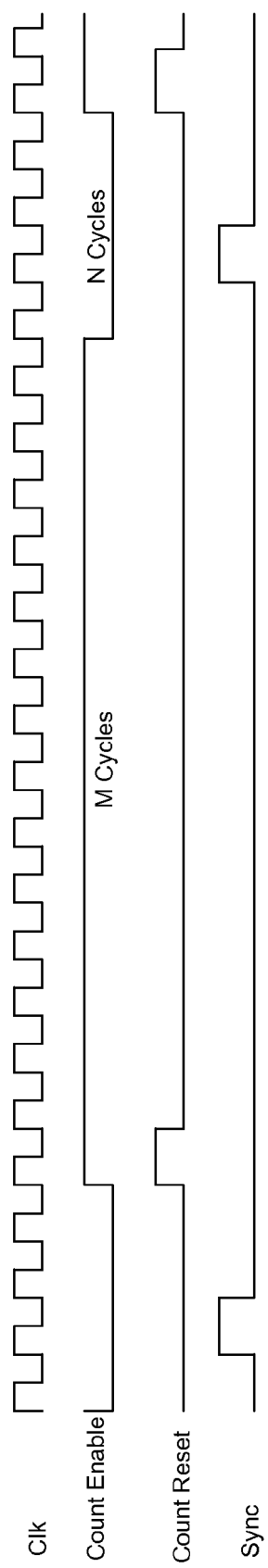
FIG. 8 shows an exemplary timeline for operations of the digital voltage comparator in FIG. 7 according to an embodiment of the present disclosure.

Operations of the digital voltage comparator 722 will now be described with reference to FIG. 8 according to an embodiment. FIG. 8 shows an exemplary timeline of the input clock Clk, the count reset signal, the count enable signal, and the sync signal. As shown in FIG. 8, the count controller 780 outputs the count reset signal once every M+N cycles of the clock Clk, where M and N are integers. Thus, the count controller 780 resets (clears) the count values of the first and second counters 545 and 555 every M+N cycles of the clock Clk. At each reset, the count controller 780 outputs the count enable signal to the counters 545 and 555 for M cycles (i.e., outputs a logic one to the enable inputs of the counters 545 and 555 for M cycles). As a result, each counter 545 and 555 counts the periods of the respective oscillator output signal over M cycles of the clock Clk.

After enabling the counters 545 and 555 for M cycles of the clock Clk, the count controller 780 disables the counters 545 and 555 for N cycles of the clock Clk. As a result, each counter 545 and 555 stops counting and holds its current count value for N cycles. The count value of each counter 545 and 555 indicates the number of periods of the respective oscillator output signal counted over M cycles of the clock Clk.

Each time the counters 545 and 555 are disabled for N cycles of the clock Clk, the count controller 780 outputs the sync signal to the synchronous registers 745 and 755. This causes each synchronous register 745 and 755 to read the count value of the respective counter 545 and 555, and output the count value to the subtractor 560. Thus, each synchronous register 745 and 755 outputs a count value to the subtractor 560 every M+N cycles of the clock Clk, where the count value indicates the number of periods of the respective oscillator output signal counted over M cycles of the clock clk. The values of M and N may by programmable.

Therefore, for every M+N cycles of the clock Clk, each counter 545 and 555 counts the number of periods of the respective oscillator output over M cycles, and holds the corresponding count value for the following N cycles. During the following N cycles, each synchronous register 745 and 755 reads the count value of the respective counter and outputs the count value to the subtractor 560. The subtractor 560 computes the difference between the count values to obtain a count difference, which is output to the count compare circuit 570. Thus, the subtractor 560 may outputs a count difference to the count compare circuit 570 every M+N cycles of the clock Clk.

Each time the count compare circuit 570 receives a count difference from the subtractor 560, the count compare circuit 570 may compare the count difference to the threshold count discussed above. If the count difference is above the threshold count, the count compare circuit 570 may output a logic zero to the control device 315 or 415 for approximately M+N cycles. If the count difference is below the threshold count, the count compare circuit 570 may output a logic one to the control device 315 or 415 for approximately M+N cycles. Thus, in this example, the count compare circuit 570 may update the output to the control device each time the count compare circuit 570 receives a count difference (every M+N cycles of the clock Clk).

In one embodiment, the count compare circuit 570 may not output a logic one until K consecutive count differences are below the threshold count, where K is an integer and may be programmable. This may be done, for example, to filter out glitch on the internal supply rail 114 discussed above. After K consecutive count differences are below the threshold count, the count compare circuit 570 may output a logic one for as long as the subsequent count differences are below the threshold count. In this embodiment, the control device 315 or 415 may send the fast-forward acknowledgement signal to the power sequencer 215 when the output signal from the voltage comparator 722 transitions to logic one or stays at logic one for a predetermined period of time as measured by the counter 335.

In another embodiment, the count compare circuit 570 may output a logic one as soon as a count difference is below the threshold count. In this embodiment, the control device 315 or 415 may send the fast-forward acknowledgement signal to the power sequencer 215 when the output signal from the voltage comparator 722 stays at logic one for a predetermined period of time as measured by the counter 335 discussed above.

As discussed above, the synchronous registers 745 and 755 reduce glitch in the subtractor 560. This is because the synchronous registers 745 and 755 synchronize the output of the count values to the subtractor 560. As shown in the example in FIG. 8, the sync signal to the synchronous registers 745 and 755 is synchronous with the clock Clk. In this example, operations of the subtractor 560 may also be timed according to the clock Clk. Thus, the synchronous registers 745 and 755 may align the count values from the counters 545 and 555 with the clock domain of the subtractor 560. Operations of the count compare circuit 570 may also be timed according to the clock Clk.

Operations of the digital voltage comparator 722 during power up will now be described according to embodiments of the present disclosure. Before the start of power up, the control device 315 or 415 monitors the first output 218 of the power sequencer 215 for the first switch enable signal enf. When the control device 315 or 415 detects the first switch enable signal enf, the control device 315 or 415 enables the voltage comparator 722 to begin comparing the voltage of the internal supply rail 114 with the voltage of the external supply rail 112. In the example in FIG. 7, the control device 315 or 415 may enable the first and second rings oscillators 520 and 530 and the count controller 780.

In response to the first switch enable signal enf, the first delay chain 120 in the head switch array 110 begins switching on (turning on) the weak switches 115. Initially the voltage of the internal supply rail 114 is low. As a result, the output frequency of the second ring oscillator 530 (which is powered by the internal supply rail 114) is initially much slower than the output frequency of the first ring oscillator 520 (which is powered by the external supply rail 112). Thus, the count difference is initially much larger than the threshold count value, causing the count compare circuit 570 to output a logic zero to the control device 315 or 415.

Over time the voltage of the internal supply rail 114 increases. As a result, the output frequency of the second ring oscillator 530 increases (speeds up) over time, causing the count difference to decease over time. Eventually, the count difference falls below the threshold count, indicating that the voltage of the internal supply rail 114 is within a desired amount (e.g., at least 95%) of the voltage of the external supply rail 112. When this occurs, the voltage comparator 722 may output a logic one to the control device 315 or 415.

In response, the control device 315 or 415 may output the fast-forward acknowledgement signal to the power sequencer 215 to initiate switching of the strong switches 125 in the head switch array 110. In one aspect, the control device 315 or 415 may wait for the output of the comparator 722 to stay at logic one for a period of time (as measured by the counter 335) before sending the fast-forward acknowledgement signal. After sending the fast-forward acknowledgement signal, the control device 315 or 415 may disable the rings oscillators 520 and 530 and the count controller 780 until the next power up cycle to conserve power. The control device 315 or 415 may also reset the count controller 780.

Figure 9:
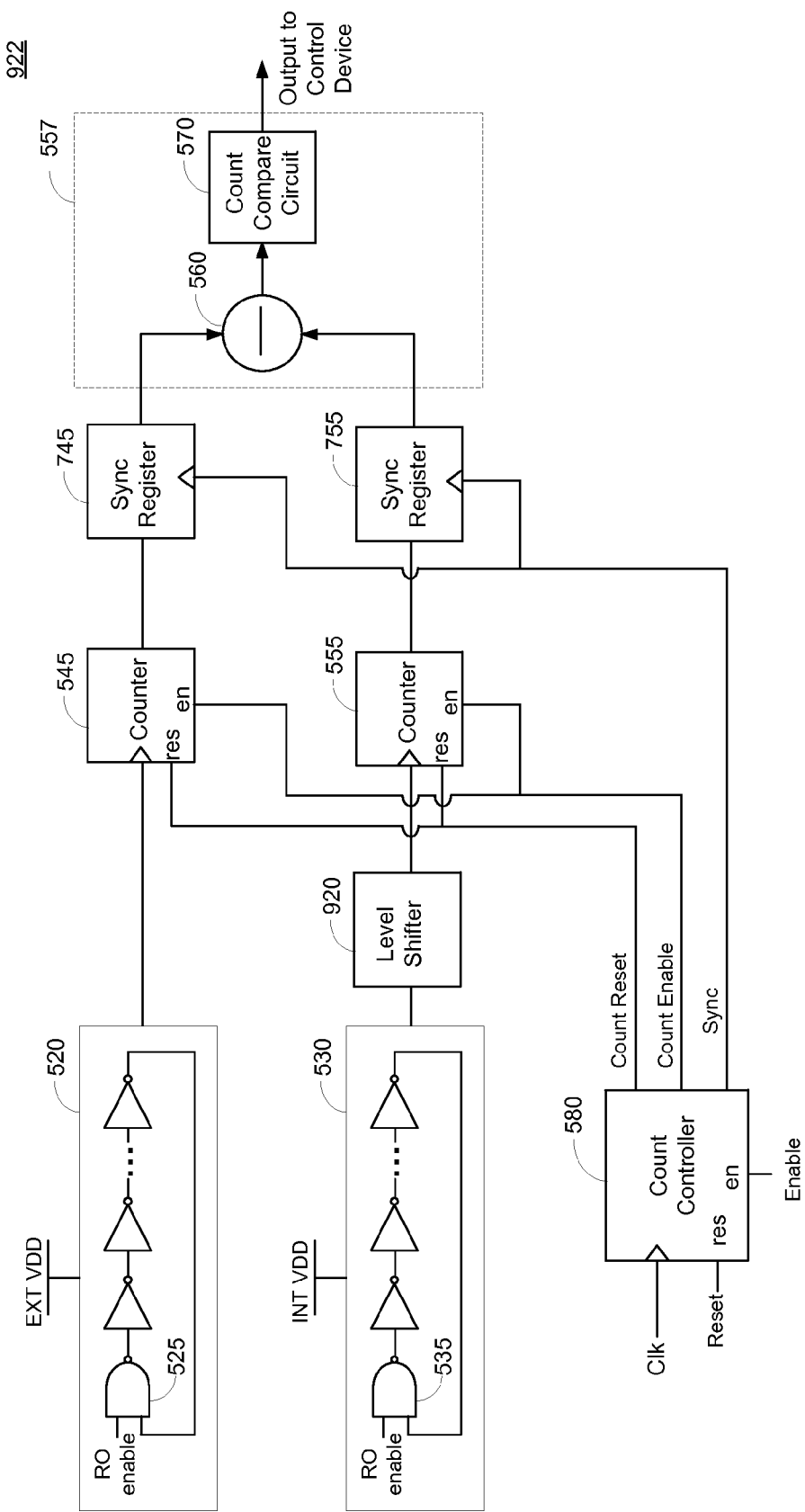
FIG. 9 shows a digital voltage comparator comprising a voltage-level shifter according to an embodiment of the present disclosure.

Since the second ring oscillator 530 is powered by the internal supply rail 114, the voltage level of the output signal of the second ring oscillator 530 is limited by the voltage of the internal supply rail 114. In particular, the output voltage of the second ring oscillator 530 may switch (toggle) between approximately INT VDD and ground at the frequency of the second ring oscillator 530. During power up, the voltage of the internal supply rail 114 may initially be low. As a result, the voltage level of the output signal of the second ring oscillator 530 may also be initially low. To address, the output signal of the second ring oscillator 530 may be voltage-level shifted before being input to the second counter 555. In this regard, FIG. 9 shows an example of the digital voltage comparator 922 in which a voltage-level shifter 920 is coupled between the output of the second ring oscillator 530 and the clock input of the second counter 555. The voltage level shifter 920 is configured to level shift the output signal of the second ring oscillator 530 so that the signal switches (toggles) between approximately EXT VDD and ground at the frequency of the second ring oscillator 530 before the signal is input to the second counter 555.

Figure 10:
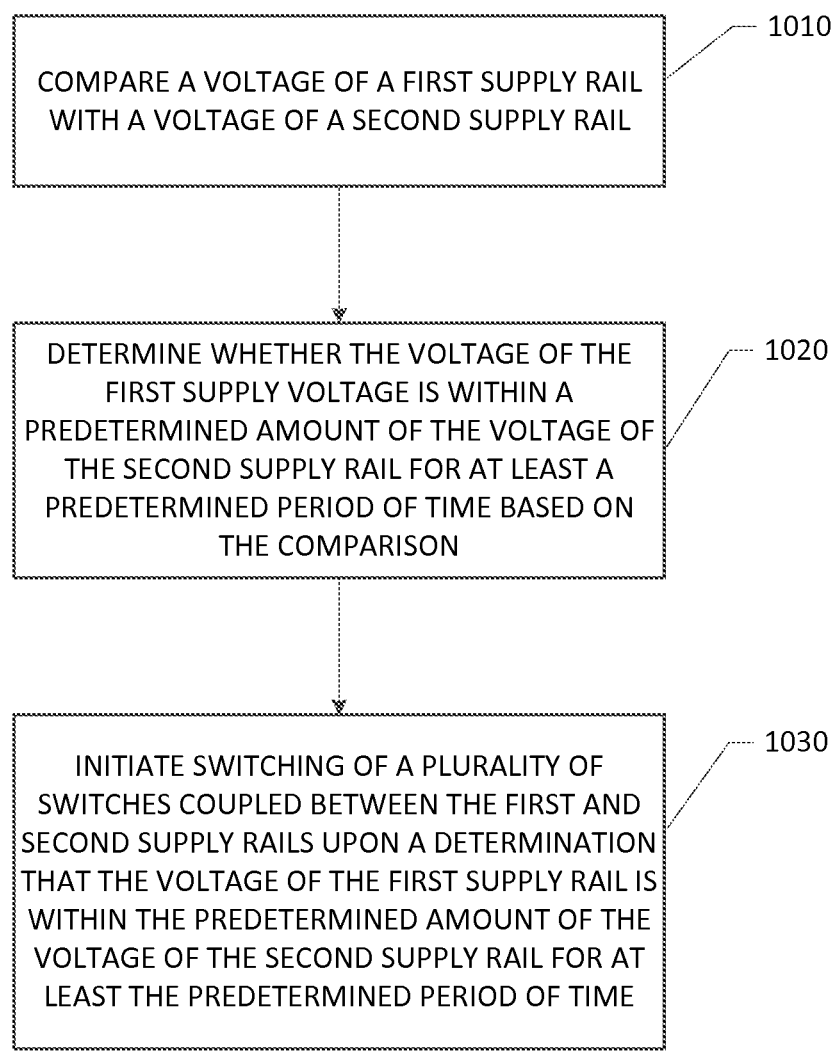
FIG. 10 is a flow diagram of a method for power up according to an embodiment of the present disclosure.

FIG. 10 is a flow diagram illustrating a method 1000 for power up according to an embodiment of the present disclosure.

In step 1010, a voltage of a first supply rail is compared with a voltage of a second supply rail. The first supply rail may be an internal supply rail (e.g., internal supply rail 114) and the second supply rail may be an external supply rail (e.g., external supply rail 112). The voltage of the first supply rail and the voltage of the second supply rail may be compared using a voltage comparator (e.g., voltage comparator 322, 422 or 522).

In step 1020, a determination is made whether the voltage of the first supply rail is within a predetermined amount of the voltage of the second supply rail for at least a predetermined period of time based on the comparison. For example, the voltage comparator (e.g., 322, 422 or 522) may output a certain logic state (e.g., logic one) when the voltage of the first supply rail is within the predetermined amount of the voltage of the second supply rail, and a determination may be made that the voltage of the first supply rail is within the predetermined amount of the voltage of the second supply rail when the voltage comparator (e.g., 322, 422 or 522) outputs the logic state (e.g., logic one). In this example, a determination may be made that the voltage of the first supply rail is within the predetermined amount of the voltage of the second supply rail for at least the predetermined amount of time when the voltage comparator outputs the logic state (e.g., logic one) for the predetermined period of time, which may be measured using a counter (e.g., counter 335).

In step 1030, switching of a plurality of switches coupled between the first and second supply rails is initiated upon a determination that the voltage of the first supply rail is within the predetermined amount of the voltage of the second supply rail for at least the predetermined period of time. For example, the plurality of switches may comprise strong switches (e.g., switches 125). Also, switching of the plurality of switches may be initiated by outputting an acknowledgement signal (e.g., fast-forward acknowledgement signal) to a power sequencer (e.g., power sequencer 215), the acknowledgement signal causing the power sequencer to switch on the plurality of switches.

Those skilled in the art would appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection may be properly termed a computer-readable medium to the extent involving non-transient storage of transmitted signals. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium, to the extent the signal is retained in the transmission chain on a storage medium or device memory for any non-transient length of time. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A power-up system, comprising:
    a voltage comparator configured to compare a voltage of a first supply rail with a voltage of a second supply rail, and to output an output signal based on the comparison, wherein the voltage comparator comprises:
        a first voltage-controlled oscillator, wherein a frequency of an output signal of the first voltage-controlled oscillator is controlled by the voltage of the first supply rail;
        a second voltage-controlled oscillator, wherein a frequency of an output signal of the second voltage-controlled oscillator is controlled by the voltage of the second supply rail;
        a first counter configured to count a number of periods of the output signal of the first voltage-controlled oscillator to obtain a first count value;
        a second counter configured to count a number of periods of the output signal of the second voltage-controlled oscillator to obtain a second count value; and
        a compare circuit configured to generate the output signal of the voltage comparator based on a difference between the first and second count values; and
    a controller configured to determine whether the voltage of the first supply rail is within a predetermined amount of the voltage of the second supply rail for at least a predetermined period of time based on the output signal of the voltage comparator, and, upon a determination that the voltage of the first supply rail is within the predetermined amount of the voltage of the second supply rail for at least the predetermined period of time, to initiate switching of a plurality of switches coupled between the first and second supply rails.

2. The system of claim 1, wherein the first supply rail is an internal supply rail, and the second supply rail is an external supply rail.

3. The system of claim 1, wherein the output signal of the voltage comparator has a first logic state when the voltage of the first supply rail is within the predetermined amount of the voltage of the second supply rail, and the controller is configured to initiate switching of the plurality of switches when the output signal of the voltage comparator stays at the first logic state for at least the predetermined period of time.

4. The system of claim 1, wherein the compare circuit is configured to compare the difference with a threshold value, and to generate the output signal of the voltage comparator based on the comparison of the difference with the threshold value.

5. The system of claim 1, further comprising:
    a first synchronous register coupled between the first counter and the compare circuit; and
    a second synchronous register coupled between the second counter and the compare circuit, wherein the first and second synchronous registers are configured to synchronously output the first and second count values, respectively, to the compare circuit.

6. The system of claim 5, further comprising a counter control circuit configured to enable the first counter for a first period of time, and to disable the first counter for a second period of time following the first period of time, wherein the first counter counts the number of periods of the output signal of the first voltage-controller oscillator during the first period of time, and the first synchronous register is configured to read the first count value from the first counter during the second period of time.

7. The system of claim 1, wherein the voltage comparator comprises:
    a voltage divider configured to scale down the voltage of the first supply rail to obtain a first scaled-down voltage, and to scale down the voltage of the second supply rail to obtain a second scaled-down voltage; and
    a comparing amplifier configured to compare the first scaled-down voltage with the second scaled-down voltage, and to generate the output signal based on the comparison of the first scaled-down voltage with the second scaled-down voltage.

8. The system of claim 7, wherein the voltage divider is configured to scale down the voltage of the second supply rail by a larger amount than the voltage of the first supply rail.

9. The system of claim 1, wherein the controller is configured to initiate switching of the plurality of switches by outputting an acknowledgement signal to a power sequencer, the acknowledgement signal causing the power sequencer to switch on the plurality of switches.

10. The system of claim 9, wherein the controller is configured to detect a signal from the power sequencer indicating a start of power up, and to enable the voltage comparator in response to the signal from the power sequencer.

11. A power-up system, comprising:
    a voltage comparator configured to compare a voltage of a first supply rail with a voltage of a second supply rail, and to output an output signal based on the comparison, wherein the output signal of the voltage comparator has a first logic state when the voltage of the first supply rail is within a predetermined amount of the voltage of the second supply rail;
    a controller configured to initiate switching of a plurality of switches coupled between the first and second supply rails when the output signal of the voltage comparator stays at the first logic state for at least a predetermined period of time; and
    a counter, wherein the controller is configured to start the counter in response to the output signal of the voltage comparator changing from a second logic state to the first logic state, to reset the counter in response to the output signal of the voltage comparator changing from the first logic state to the second logic state, and to initiate switching of the plurality of switches when a count value of the counter reaches a predetermined count value corresponding to the predetermined period of time.

12. A method for power up, comprising:
converting a voltage of a first supply rail into a first frequency using a first voltage-controlled oscillator controlled by the voltage of the first supply rail;
converting a voltage of a second supply rail into a second frequency using a second voltage-controlled oscillator controlled by the voltage of the second supply rail;
converting the first frequency into a first count value using a first counter;
converting the second frequency into a second count value using a second counter;
determining a count difference between the first and second count values;
determining whether the voltage of the first supply rail is within a predetermined amount of the voltage of the second supply rail for at least a predetermined period of time based on the count difference; and
initiating switching of a plurality of switches coupled between the first and second supply rails upon a determination that the voltage of the first supply rail is within the predetermined amount of the voltage of the second supply rail for at least the predetermined period of time.

13. The method of claim 12, wherein the first supply rail is an internal supply rail, and the second supply rail is an external supply rail.

14. The method of claim 12, wherein determining whether the voltage of the first supply rail is within the predetermined amount of the voltage of the second supply rail for at least the predetermined period of time comprises determining that the voltage of the first supply rail is within the predetermined amount of the voltage of the second supply rail for at least the predetermined period of time when the count difference is below a threshold for at least the predetermined period of time.

15. A method for power up, comprising:
comparing a voltage of a first supply rail with a voltage of a second supply rail;
determining whether the voltage of the first supply rail is within a predetermined amount of the voltage of the second supply rail based on the comparison;
counting with a counter while the voltage of the first supply rail is determined to be within the predetermined amount of the voltage of the second supply rail;
determining that the voltage of the first supply rail is within the predetermined amount of the voltage of the second supply rail for at least a predetermined period of time when a count value of the counter reaches a count value corresponding to the predetermined period of time; and
initiating switching of a plurality of switches coupled between the first and second supply rails upon a determination that the voltage of the first supply rail is within the predetermined amount of the voltage of the second supply rail for at least the predetermined period of time.

16. An apparatus for power up, comprising:
means for converting a voltage of a first supply rail into a first frequency;
means for converting a voltage of a second supply rail into a second frequency;
means for converting the first frequency into a first count value;
means for converting the second frequency into a second count value;
means for determining a count difference between the first and second count values;
means for determining whether the voltage of the first supply rail is within a predetermined amount of the voltage of the second supply rail for at least a predetermined period of time based on the count difference; and
means for initiating switching of a plurality of switches coupled between the first and second supply rails upon a determination that the voltage of the first supply rail is within the predetermined amount of the voltage of the second supply rail for at least the predetermined period of time.

17. The apparatus of claim 16, wherein the first supply rail is an internal supply rail, and the second supply rail is an external supply rail.

18. The apparatus of claim 16, further comprising:
means for counting while the voltage of the first supply rail remains within the predetermined amount of the voltage of the second supply rail;
wherein the means for determining whether the voltage of the first supply rail is within the predetermined amount of the voltage of the second supply rail for at least the predetermined period of time comprises means for determining that the voltage of the first supply rail is within the predetermined amount of the voltage of the second supply rail for at least the predetermined period of time when a count value of the means for counting reaches a count value corresponding to the predetermined period of time.

19. The apparatus of claim 16, wherein the means for determining whether the voltage of the first supply rail is within the predetermined amount of the voltage of the second supply rail for at least the predetermined period of time comprises means for determining that the voltage of the first supply rail is within the predetermined amount of the voltage of the second supply rail for at least the predetermined period of time when the count difference is below a threshold for at least the predetermined period of time.

\* \* \* \* \*